United States Patent
Flanigan et al.

[19]

[11] Patent Number: 6,081,414
[45] Date of Patent: Jun. 27, 2000

[54] APPARATUS FOR IMPROVED BIASING AND RETAINING OF A WORKPIECE IN A WORKPIECE PROCESSING SYSTEM

[75] Inventors: Allen Flanigan, San Jose; Michael N. Sugarman, San Francisco, both of Calif.

[73] Assignee: Applied Materials, Inc., Santa Clara, Calif.

[21] Appl. No.: 09/071,784

[22] Filed: May 1, 1998

[51] Int. Cl.[7] .................................................. H02N 13/00
[52] U.S. Cl. .......................................... 361/234; 279/128
[58] Field of Search ................................... 361/233–235; 279/128

[56] References Cited

U.S. PATENT DOCUMENTS

| | | | |
|---|---|---|---|
| 5,147,497 | 9/1992 | Nozawa et al. | 156/626 |
| 5,155,652 | 10/1992 | Logan et al. | 361/234 |
| 5,191,506 | 3/1993 | Logan et al. | 361/234 |
| 5,228,501 | 7/1993 | Tepman et al. | 165/80.1 |
| 5,250,137 | 10/1993 | Arami et al. | 156/345 |
| 5,310,453 | 5/1994 | Fukasawa et al. | 156/643 |
| 5,376,213 | 12/1994 | Ueda et al. | 156/345 |
| 5,463,526 | 10/1995 | Mundt | 361/234 |
| 5,567,267 | 10/1996 | Kazama et al. | 156/345 |
| 5,571,366 | 11/1996 | Ishii et al. | 156/345 |
| 5,581,874 | 12/1996 | Aoki et al. | 19/825 |
| 5,584,971 | 12/1996 | Komino | 204/192.13 |
| 5,625,526 | 4/1997 | Watanabe et al. | 361/234 |
| 5,656,093 | 8/1997 | Burkhart et al. | 118/728 |

FOREIGN PATENT DOCUMENTS

| | | | |
|---|---|---|---|
| 0 693 770 A1 | 1/1996 | European Pat. Off. | H01L 21/00 |
| 0 827 187 A2 | 3/1998 | European Pat. Off. | H01L 21/00 |
| 2 256 084 | 11/1992 | United Kingdom | H01J 37/32 |
| WO 95/20838 | 8/1995 | WIPO | H02N 13/00 |

*Primary Examiner*—Fritz Fleming
*Attorney, Agent, or Firm*—Thomason, Moser and Patterson

[57] ABSTRACT

Apparatus for biasing and retaining a wafer in a semiconductor wafer processing system. The apparatus has a pedestal, a puck and an electrode disposed between the pedestal and the puck. The pedestal defines an enclosure within which the electrode and other pedestal components are housed. The electrode may serve as a cooling plate for the puck. Each of the components is insulated so as to define an electrical path. The electrical path consists of a conductor connected to a coolant tube inside the enclosure and the cooling plate which is in contact with the coolant tube. The cooling plate is electrically isolated from the pedestal via an isolator ring that circumscribes an upper inner wall of the enclosure. The coolant tube is disposed in a channel on the bottomside of the cooling plate and affixed to the plate so as to establish physical contact. The coolant tube and plate conduct RF power from a power source connected to the tube. The power then capacitively couples through the electrostatic chuck to bias a wafer retained thereon. The cooling plate also provides for temperature control of the wafer via a plurality of grooves on the top surface of the plate.

24 Claims, 4 Drawing Sheets

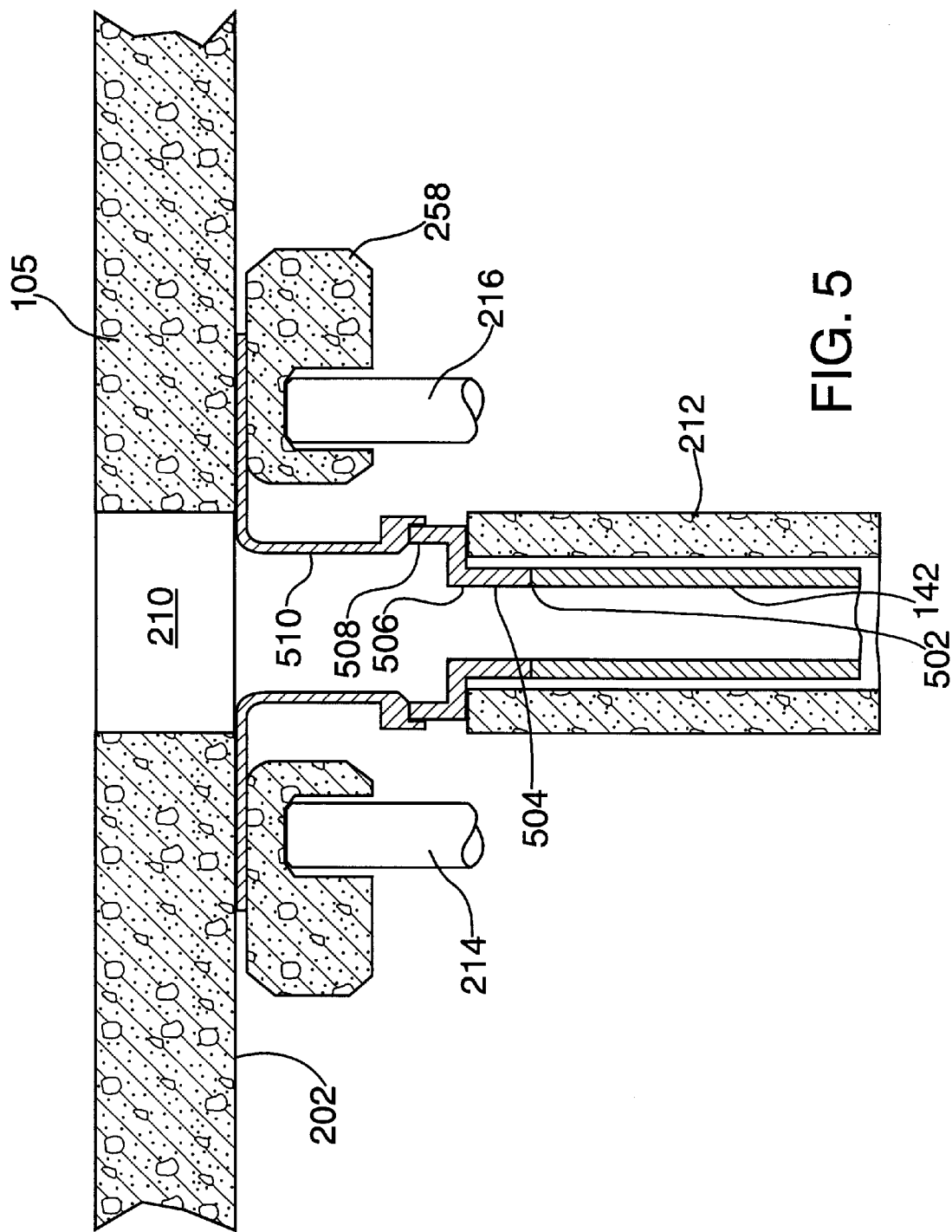

APPARATUS FOR IMPROVED BIASING AND RETAINING OF A WORKPIECE IN A WORKPIECE PROCESSING SYSTEM

BACKGROUND OF THE INVENTION

1. Field of the Invention

The invention relates generally to plasma-enhanced processing of a workpiece, e.g., a semiconductor wafer, and, more specifically, to an apparatus for improving the biasing and retention of a workpiece upon a workpiece support in a semiconductor wafer processing system.

2. Description of the Background Art

Plasma-enhanced processes have become increasingly important to the semiconductor industry, providing for precisely controlled thin-film depositions. For example, a plasma reactor in a high-temperature physical vapor deposition (PVD) semiconductor wafer processing system generally comprises a reaction chamber for containing a reactant gas, a pair of spaced-apart electrodes (cathode and anode) that are driven by a high power DC voltage to generate an electric field within the chamber, and a workpiece support for supporting a workpiece within the chamber. The cathode is a conductive plate coated with a target material that is to be sputtered or deposited onto the workpiece, while the anode is typically a grounded chamber component. The electric field, creating a reaction zone, captures electrons thereby ionizing the reactant gas into a plasma. The plasma, characterized by a visible glow, is a mixture of positive and negative reactant gas ions and electrons. Ions from the plasma bombard the negatively biased target releasing electrically neutral deposition material. As such, a conductive deposition film forms on the workpiece which is supported and retained upon the surface of the workpiece support. In such plasma reactors, the workpiece support is fabricated from a dielectric material such as ceramic. However, at wafer processing temperatures (typically in the range of 200–600° C.) the resistivity of the ceramic is reduced and the workpiece support becomes more conductive. This characteristic is exploited to electrostatically clamp a workpiece, e.g., a semiconductor wafer, being processed to the surface of the workpiece support via the Johnson-Rahbek effect. A detailed explanation of the Johnson-Rahbek effect and an electrostatic chuck employing this feature is described in U.S. Pat. No. 5,463,526 issued Oct. 31, 1995 to Mundt herein incorporated by reference. This patent discloses a robust semiconducting layer covered by a thin insulating layer. When the semiconducting layer is biased, charges build up beneath the insulating layer. Since neither the semiconducting nor insulating layer is perfectly smooth, portions of the semiconducting layer are not totally covered by the insulating layer. As such, some of the charges pass from the semiconducting layer, through gaps in the insulating layer to workpiece retained by this electrostatic chuck. This charge migration phenomenon greatly increases the attractive force exerted on the workpiece.

To further enhance deposition in an ion metallization system, a specific type of PVD system, the substrate and pedestal are biased negatively with respect to the plasma. This is accomplished by providing RF power to the pedestal. A negative DC offset accumulates on the pedestal as a result of the higher velocity of electrons as compared to the positive ions in the plasma. In some processes, as neutral target material is sputtered from the target and enters the plasma, the target material becomes positively ionized. With the negative DC offset at the pedestal, the positively ionized target material is attracted to and deposits on the substrate more readily than on an unbiased pedestal. Ordinarily, a 400 KHz AC source is used to bias the pedestal, but other frequency sources such as a 13.56 MHz source may also be used.

Unfortunately, ceramic workpiece supports (also known as electrostatic chucks) cannot be used in RF enhanced PVD reaction chambers. The conductive nature of the ceramic at wafer processing conditions is beneficial to electrostatic chucking, but not to establishment of an effective RF induced electric field in the reaction zone. As such, other types of electrostatic chucks are used in RF enhanced chambers. For example, an electrostatic chuck consisting of a conductive layer, e.g., copper, encased in upper and lower insulating layers, e.g., polyimide, is adhered to a support surface of a pedestal. This type of electrostatic chuck is referred to as a Coulombic chuck since the mechanism of attraction of the workpiece to the support surface is a Coulombic force. Coulombic forces are usually weaker and do not retain a workpiece as well as electrostatic chucks employing the Johnson-Rahbek effect.

Consequently, there is a need for an apparatus that can electrostatically retain a workpiece with a ceramic chuck to take full advantage of the Johnson-Rahbek effect. Additionally, the apparatus must effectively bias the workpiece with RF power without compromising the integrity of the related RF electric field or the plasma in the processing chamber.

Therefore, there is a need in the art for an apparatus that optimally conducts RF power through a ceramic chuck.

SUMMARY OF THE INVENTION

The disadvantages heretofore associated with the prior art are overcome by an apparatus for biasing and retaining a wafer in a semiconductor wafer processing system. The inventive apparatus has a shaft, a pedestal base disposed above the shaft, a puck disposed above the pedestal base and an electrode disposed beneath the puck. The electrode is coupled to a biasing source. The shaft, pedestal base and puck define an enclosure within which the electrode and various other pedestal components are housed. Each of the components are insulated from each other and from the electrode so as to define a particular electrical path. Specifically, RF power conducts from a power source to a conductor to a coolant tube inside the enclosure. The electrode is a cooling plate in contact with the coolant tube and the puck.

The cooling plate is electrically isolated from the pedestal base via an isolator ring that circumscribes an upper inner wall of the enclosure. The ring is fabricated from an insulating material, e.g., ceramic, and is provided with a lip upon which the plate sits. The cooling plate is held in close contact with the bottom surface of the puck via springs in the isolator ring that impart a force against the floor of the enclosure and the cooling plate. The top surface of the cooling plate may be provided with grooves to reduce the surface area of the top surface to effect proper heat exchange conditions between the puck and the cooling plate. Additionally, the cooling plate is provided with a channel on its underside. The coolant tube is disposed in the channel and affixed i.e., brazed, to the cooling plate so as to establish physical contact.

In the above described configuration, a workpiece, i.e., a semiconductor wafer is positioned on a top surface of the puck, i.e., and electrostatic chuck for processing. The RF power applied by the power source conducts through the intended electrical path and capacitively couples through the dielectric material of the electrostatic chuck. As such, the wafer is electrically biased to a level that is favorable to wafer processing without biasing the pedestal or any of the components in the enclosure. Insulating pedestal components reduces the likelihood of RF power losses. Insulating the pedestal reduces the likelihood of arcing between the pedestal and other components in a wafer processing chamber.

BRIEF DESCRIPTION OF THE DRAWINGS

The teachings of the present invention can be readily understood by considering the following detailed description in conjunction with the accompanying drawings, in which:

FIG. 5 depicts a detailed view of the interconnection of various components within the present invention.

DETAILED DESCRIPTION

Figure 1:
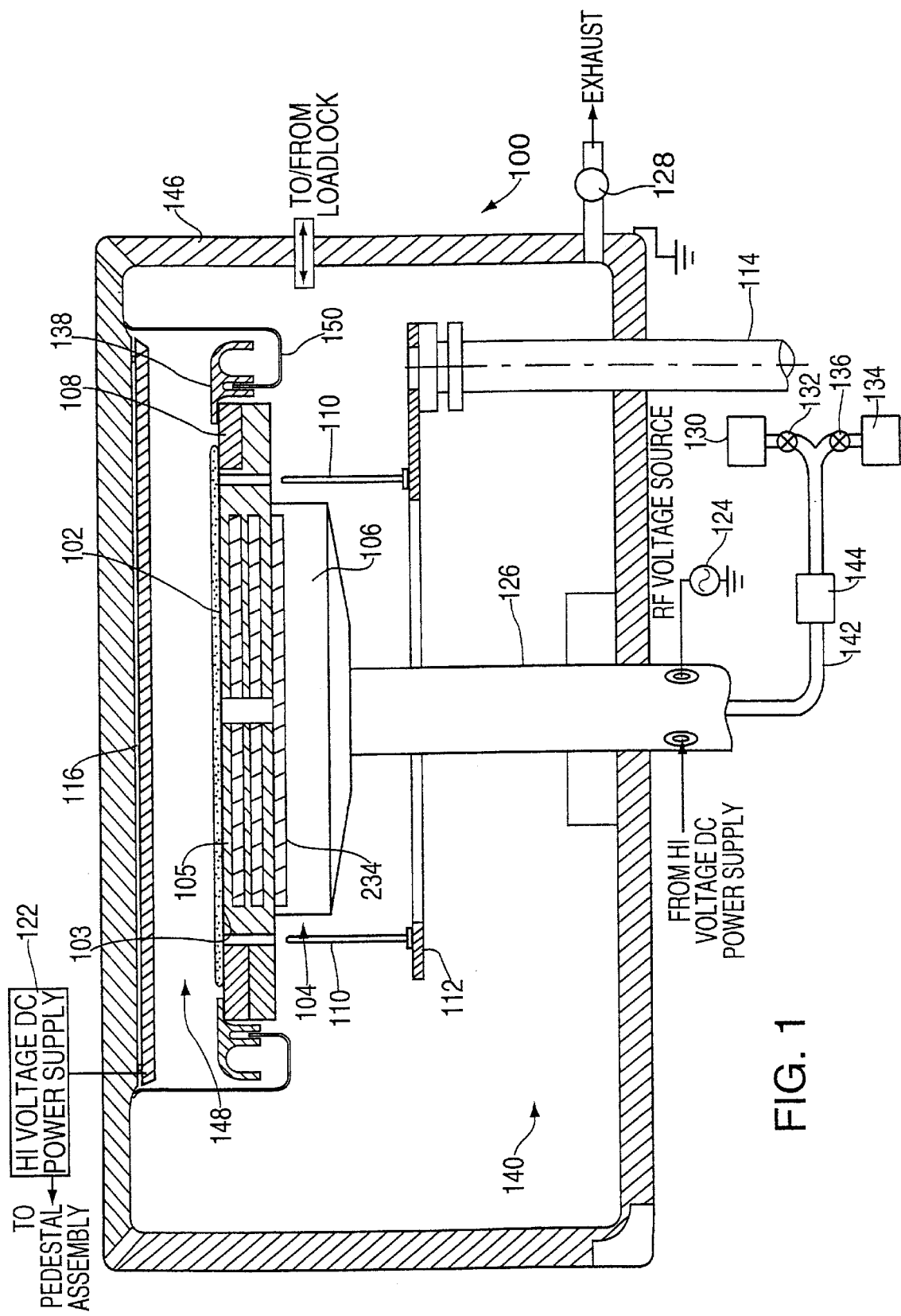
FIG. 1 depicts a partial cross-sectional view of a workpiece processing chamber housing the present invention.

FIG. 1 depicts a cross-sectional view of a PVD processing chamber 100 for processing a workpiece 102, i.e., a semiconductor wafer in a workpiece processing system. For a detailed understanding of the PVD processing chamber 100 and its operation in processing a wafer, the reader should refer to the drawings and the detailed description contained in commonly assigned U.S. Pat. No. 5,228,501, issued Jul. 20, 1993 to tepman et al. incorporated herein by reference. That disclosure discloses a wafer support assembly used in a physical vapor deposition chamber manufactured by Applied Materials, Inc. of Santa Clara, Calif.

The wafer 102 is disposed on a novel apparatus 104 for retaining the wafer against a workpiece support and providing RF biasing to the wafer in a well-defined and insulated path that is internal to the apparatus. Specifically, the wafer 102 rests on support surface 103 of a pedestal assembly 104. The pedestal assembly 104 has a puck 105, i.e., an electrostatic chuck, supported by a pedestal base 106 and a shaft 126 which contains the necessary wiring to conduct DC and RF power from remote power sources 122 and 124 to the pedestal assembly 104. Although the puck 105 is discussed as being an electrostatic chuck, it need not be such a device. Alternately, the puck may be a heater used in a chemical vapor deposition (CVD) process system (i.e., having no electrostatic chucking capabilities) or any other type of general purpose workpiece support in a system requiring RF biasing of the workpiece. Additionally, the shaft 126 is provided with a gas conduit 142 to feed a gas through the pedestal assembly 104 to a process cavity 148 located directly above the pedestal assembly 104. Lift pins 110 mounted on a platform 112 connected to a vertical shaft 114 serve to lift the wafer 102 off the support surface 103 after processing.

A target 116 of sputtering or deposition material is positioned over the pedestal assembly 104. The target 116 is usually Aluminum or Titanium and is electrically insulated from the chamber 100. The remote power source 122 is preferably a high voltage DC power supply and is electrically connected between the target 116 and pedestal assembly 104 for magnetron sputtering a wafer. Additionally, an RF (radio frequency) voltage source 124 is coupled to the pedestal assembly 104 as explained in greater detail below. Waste ring 108, cover ring 138 and shield 150 circumscribe the pedestal assembly 104 to prevent unwanted deposition into the lower chamber region 140.

Figure 2:
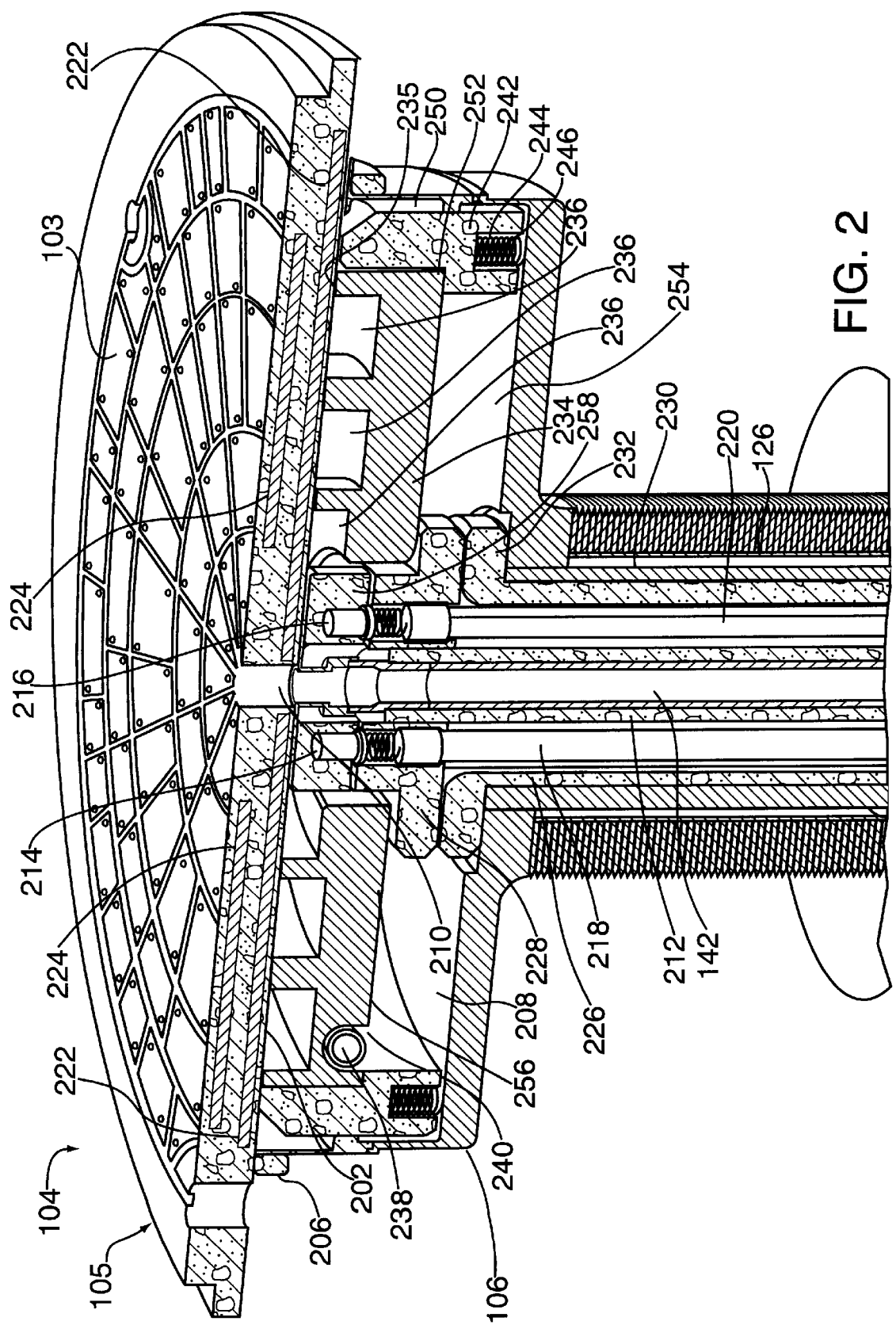
FIG. 2 depicts a partial perspective, cross-sectional view of an upper portion of the present invention.

FIG. 2 depicts a partial perspective, cross-sectional view of pedestal assembly 104. Specifically, the pedestal assembly 104 has an electrostatic chuck 105 disposed on top of the pedestal base 106. The pedestal base 106 is usually fabricated from a durable material, e.g., nickel, an alloy or a similar metallic material. In a preferred embodiment of the invention, the pedestal base is KOVAR®. KOVAR® is the tradename for an iron/nickel/cobalt alloy manufactured and sold by Westinghouse Electric Co. The electrostatic chuck 105 can be fabricated from a dielectric material e.g., a ceramic such as silicon oxide, silicon nitride, sapphire or the like and is shaped as a thin circular puck. The chuck 105 is attached to the pedestal base 106 via a retaining ring 206. For example, retaining ring 206 is a ceramic ring that is brazed to electrostatic chuck 105 and an upper inner wall 250 of the pedestal base 106. Additionally, the upper inner wall 250 and a bottom surface 202 of the electrostatic chuck 105 are brazed for additional strength. An example of a ceramic electrostatic chuck that may be used in this apparatus is disclosed in commonly assigned U.S. Pat. No. 5,656,093 issued Aug. 12, 1997 to Burkhart and is incorporated by reference herein. Specifically, that reference discloses a ceramic electrostatic chuck having a wafer spacing mask of metallic material deposited on the chuck surface.

Within the body of the electrostatic chuck 105 there are various conducting elements that assist in workpiece processing. For example, a heater electrode 222 may be buried within layers of the electrostatic chuck 105. The heater electrode 222 is fabricated from a conductive material, (e.g., tungsten) and is connected to a remote power source (not shown). In this way, the heater electrode 222 generates heat which is transferred to the workpiece on top of the electrostatic chuck 105 to maintain the workpiece at proper processing temperatures. Additionally, the electrostatic chuck 105 may be provided with one or more chucking electrodes 224. The chucking electrodes 224 are also fabricated from a conductive material, (e.g., tungsten), but not necessarily the same material from which the heater electrode 222 is fabricated. The chucking electrodes 224 are disposed relatively closely to the top surface 103 of the electrostatic chuck 105. The chucking electrodes 224 are also connected to a remote power source, i.e. the high voltage DC power supply 122 of FIG. 1. In this way, the chucking electrodes 224 provide the necessary electrostatic force to the backside of a workpiece to retain it on the electrostatic chuck 105. The chucking electrodes 224 may be in any configuration necessary to retain the workpiece upon the puck. For example, the chucking electrodes 224 may be in a monopolar configuration, bipolar configuration, zoned chucking configuration or the like. Additionally, the power source which energizes the chucking electrodes 224 may also be the power source for the heater electrode 222.

The pedestal assembly 104 defines an enclosure 208 in which various components are housed to aid in the processing of a semiconductor wafer (not shown) placed upon the top surface 103 of the electrostatic chuck 105. Specifically, the enclosure 208 is defined by a lower inner wall 230 of the shaft 126, floor 254 of the pedestal base 106, upper inner wall 250 of the pedestal base 106 and a bottom surface 202 of the electrostatic chuck 105. The gas conduit 142 extends vertically from the bottom of the shaft 126 to the bottom surface 202 of the electrostatic chuck 105 to allow a heat transfer gas to be pumped under the wafer during processing. A detailed depiction of the gas conduit 142 interfacing with the bottom surface 202 of the electrostatic chuck 105 is seen in FIG. 5 and the reader should simulataneously refer to FIGS. 2 and 5 for a complete description. A top end 502 of the gas conduit 142 is connected to a bottom end 504 of a transition tube 506. A top end 508 of the transition tube 506 is connected to a flanged transition 510 that communicates with an opening 210 provided in the electrostatic chuck 105. Preferably transition tube 506 is 0.25 in long, metallic, welded to the gas conduit 142 and brazed to the flanged transition 510. The flanged transition 510 is preferably KOVAR® and is brazed to the bottom surface 202 of the electrostatic chuck 105 and a gas conduit backup ring 258 (explained in greater detail below). The flanged transition 510 prevents the heat transfer gas from leaking into the enclosure 208 which may reduce control of the wafer temperature. Additionally, the flanged transition 510 prevents atmospheric gases and pressure gradients from being introduced to the backside of the wafer which may cause process anomalies. The heat transfer gas is pumped from one or more remote sources 130 and 134 of FIG. 1 which is connected to a second end of the gas conduit 142 via a flow regulator 144 and one or more valves 132 and 136 of FIG. 1. Additionally, the gas conduit 142 is provided with an isolator 212. The isolator 212 is fabricated from an insulating material. Preferably, the isolator 212 is a ceramic sleeve which prevents the gas conduit 142 from contacting any other components inside the enclosure 208.

The enclosure 208 is further provided with thermocouples 214 and 216 to monitor internal temperature of the pedestal, i.e., the chuck surface. Specifically, the thermocouples 214 and 216 are contained within counterbores 512 and 514 respectively in the gas conduit backup ring 258 (see FIG. 5). The thermocouples extend vertically therefrom to the bottom of the shaft 126 where they are connected to temperature measuring equipment (not shown). Thermocouples 214 and 216 are provided with isolators 218 and 220 respectively. Preferably, isolators 218 and 220 are ceramic sleeves that prevent each of the thermocouples 214 and 216 from contacting any other components inside the enclosure. Therefore, the gas conduit 142 and thermocouples 214 and 216 are insulated from all electrically conductive components such as heater electrode 222, chucking electrodes 224 and RF conducting components such as a cooling plate 234 and coolant tube 238 described in greater detail below. In an alternate embodiment of the invention, the thermocouples are mounted directly into the bottom surface 202 of the pedestal 105.

To further enhance the electrical isolation of the pedestal assembly 104, the pedestal base 106 and shaft 126 are grounded to prevent plasma ignition in the lower chamber region 140. These components are also further provided with a bellows isolator 226 and bellows thermocouple mount 228. The bellows isolator 226 is preferably fabricated from an insulating material, such as ceramic. Further, the bellows isolator 226 is in the form of a sleeve which insulates the lower inner wall 230 of the shaft 126 from all other components inside the enclosure 208. The bellows isolator 226 vertically extends from the bottom of the shaft 126 to the enclosure 208 and forms a lip 232 over floor 254 to support the bellows thermocouple mount 228. The bellows thermocouple mount 228 provides additional electrical isolation of the thermocouples 214 and 216 and gas conduit 142 within the enclosure 208. Although, the bellows thermocouple mount 228 is shown with two thermocouples mounted, the thermocouple mount 228 can be designed and configured to accept any number of thermocouples, i.e., at least one. Additionally, the thermocouple mount 228, bellows insulator 226 and/or similar integrated structures for mounting a thermocouple can be used in different pedestal and electrostatic chuck configurations.

The enclosure 208 contains further components which assist in biasing of the workpiece (wafer) 102 and optionally temperature control of the workpiece retained upon the electrostatic chuck 105. An electrode 234 is disposed between the electrostatic chuck 105 and the pedestal 104. Specifically, the electrode 234 is disposed directly below the electrostatic chuck 105 inside the enclosure 208. Preferably, the electrode 234 is fabricated from a material that is a high conductor of RF power. In a preferred embodiment of the invention, the electrode has the form of a cooling plate 234 fabricated of a block of copper or stainless steel that is machined to a high degree of precision so that it fits and communicates with other enclosure components as described below. The cooling plate 234 has a top surface 235. The top surface may have a plurality of grooves 236. The grooves 236 reduce the surface area of the top surface 235 of the cooling plate 234 that is in contact with the electrostatic chuck 105 such that the amount of heat extracted from the chuck (and wafer) is moderated. The size and number of the grooves 236 may be of any dimension, amount or configuration so as to achieve the desired cooling effect of the plate 234. Additionally, the cooling plate 234 may be plated to prevent oxidation of the cooling plate material. Preferably, the plating material is nickel.

A coolant tube 238 is disposed in a channel 240 on a bottom 256 of the plate 234. The coolant tube 238 circumscribes nearly the entire bottom 256 of the cooling plate 234 and extends down the shaft 126 within the bellows isolator 226. In a preferred embodiment of the invention, the coolant tube 238 is fashioned from an RF conductive material such as stainless steel. Additionally, the coolant tube 238 may have a plurality of coatings or platings. For example, a copper plating improves the RF conductivity of the coolant tube and a nickel plating prevents oxidation of the stainless steel and copper. The coolant tube 238 is affixed to the channel 240 by any means known to establish and maintain physical contact between the coolant tube 238 and the plate 234. Specifically, the coolant tube 238 is brazed to the channel 240 but this does not preclude affixing the coolant tube to the cooling plate 234 by other means.

The cooling plate 234 is maintained in close physical contact with the bottom 202 of the electrostatic chuck 105 via an insulator 242. The insulator 242 is preferably an isolator ring fabricated from a dielectric material, e.g., ceramic and circumscribes but not necessarily touches the upper inner wall 250. The isolator ring 242 is further provided with a lip 252 upon which the cooling plate 234 rests. To maintain the cooling plate 234 in close physical contact with the bottom 202 of the electrostatic chuck 105, the isolator 242 is tensioned. Specifically, the isolator ring 242 defines one or more recesses 244. Within each recess 244 a spring 246 is disposed. The springs 246 bear upon the floor 254 of the enclosure 208 and the isolator ring 242. The resultant force from the springs 246 maintain the cooling plate 234 in close physical contact with the bottom 202 of the electrostatic chuck 105. Since the isolator ring 242 is fabricated from a dielectric material, it does not form a highly conductive pathway between the cooling plate 234, the pedestal base 106 and other components in the enclosure 208. If the electrode 234 functions solely as an electrode and is not used for other tasks (i.e., cooling), it may be secured to the bottom 202 of the electrostatic chuck 105 by any standard form of mechanical contact such as brazing.

Figure 3:
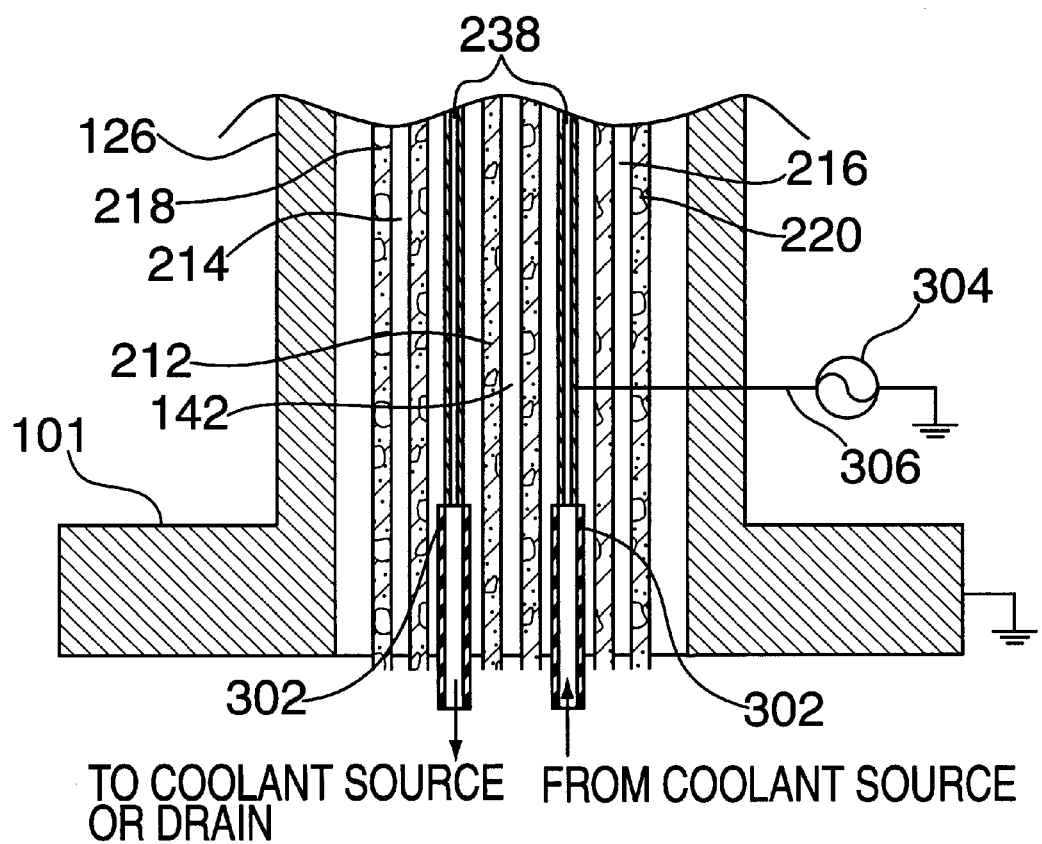
FIG. 3 depicts a cross-sectional view of a lower portion of the present invention.

FIG. 3 depicts a schematic cross-sectional view of the bottom portion of the shaft 126. The coolant tube 238 extends down through the enclosure 208 and shaft 126 and is provided with barbed ends (not shown). The barbed ends easily catch and are connected to coolant lines 302 of electrically insulating material (e.g., rubber). The coolant lines 302 are further coupled to a remote cooling source (not shown) to provide a forward and return path for a coolant (i.e., water) to the cooling plate 234. Additionally, the coolant tube 238 is electrically connected to an RF power source 304 via conductor 306. The pedestal base 106 and shaft 126 are electrically connected to ground. If the electrode 234 functions solely as an electrode and is not used for other tasks (i.e., cooling), it may be electrically connected to the RF power source 304 by any standard connection such as a wire lead, shielded cable or the like.

In operation, a wafer 102 is placed on the support surface 103 of the electrostatic chuck 105. Air is drawn out of the chamber 100 via a vacuum pump 128 to create a low pressure environment (i.e. 1 mTorr to 5 Torr). A reactant gas, preferably Argon, is introduced into the chamber 100 from one of the remote gas sources 130 or 134. The power supply 122 is energized which electrostatically clamps the wafer 102 to the support surface 103. Specifically, the power supply 122 applies a DC bias to the chucking electrodes 224. The high voltage level produced by the power supply 122 also ignites the gas into a plasma and biases the target 116 thereby causing the target material to sputter onto the wafer 102.

The apparatus described above provides for enhanced plasma processing by RF biasing the wafer 102 placed on top of the electrostatic chuck 105 via conductive and capacitive coupling of the RF power through various pedestal components. Specifically, RF power provided by RF power source 304 conducts through the coolant tube 238. Since the coolant tube 238 is copper plated, it readily conducts the RF power to the cooling plate 234 through the physical connection (e.g., brazed joint or the like). The electrode (i.e., cooling plate) 234, being fabricated from a highly RF conducting material (e.g., copper or stainless steel), is capable of readily conducting the RF power from the coolant tube 238 to the bottom surface 302 of the electrostatic chuck 105. Since the electrostatic chuck 105 is fabricated from a dielectric, or high resistance material, the RF power does not readily conduct through the body of the electrostatic chuck 105. However, the electrodes embedded within the puck body, i.e., heater electrode 222 and chucking electrode 224 allow the RF power to capacitively couple through the electrostatic chuck 105.

Figure 4:
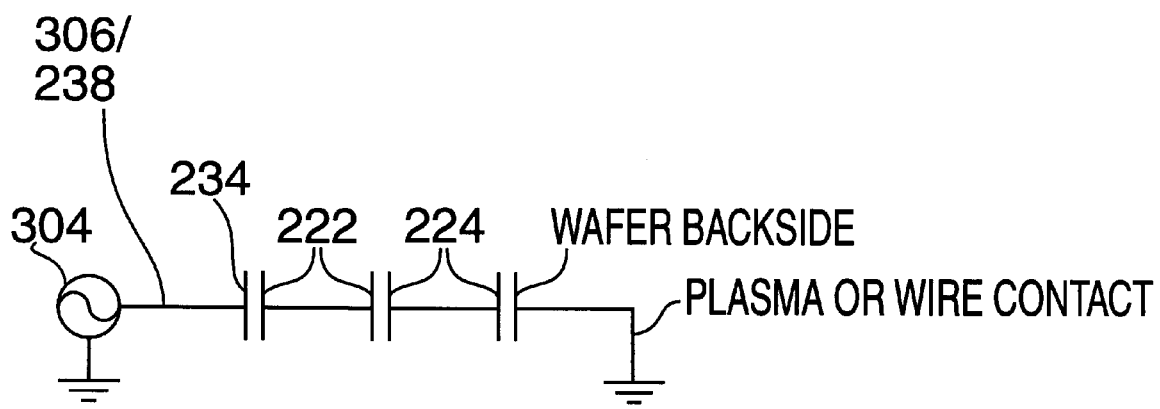
FIG. 4 depicts a schematic representation of an electrical circuit established by the present invention.

FIG. 4 depicts a schematic diagram of the electrical circuit that transfers the RF power to the backside of the workpiece. Specifically, RF power source 304 is connected to electrode (cooling plate) 234 via conductor 306 and coolant tube 238. A first capacitance exists between the cooling plate 234 and the heater electrode 222. The capacitance is a function of the thickness and dielectric constant of the puck body material between the plate 234 and heater electrode 222. Similarly, a second capacitance exists between the heater electrode 222 and the chucking electrodes 224. In similar fashion, a third capacitance exists between the chucking electrodes 224 and the backside of a workpiece 102 resting on the electrostatic chuck 105. The third capacitance is a function of the thickness and dielectric constants of both the puck body material and the small gaps that may exist between the support surface 103 and the backside of the workpiece. The workpiece is then electrically connected to ground to complete the circuit. The connection to ground may be in a variety of forms including contact with a plasma, contact wire to ground, or the like.

Establishing a well defined path for the RF power to couple through is highly advantageous especially in systems using a plasma to process a workpiece. Specifically, with the insulator ring 242 inside the enclosure 208, the RF power couples directly through the cooling plate 234 and not through other pedestal components. As such, the likelihood of short circuiting the RF power source or encountering unnecessary power losses e.g., parasitic capacitances, is greatly reduced. Additionally, since the pedestal 104 is insulated from the RF power and grounded, plasma ignition in the lower chamber region is not likely. The subject apparatus allows for better RF coupling and cooling to the workpiece without adding undue complexity to the pedestal 104 or its inner components. Alternately, if the apparatus is to be used in a low temperature processing environment, where cooling capabilities are not a great concern, one can easily see that the electrode taking the form of a metallic body brazed or otherwise attached to the electrostatic chuck can achieve the same biasing and RF power coupling as shown and described for the cooling plate embodiment. As such, the scope of the application should be limited to a cooling plate configuration, but to any type of external biasing member in contact with a ceramic substrate to bias a wafer retained thereon.

Although various embodiments which incorporate the teachings of the present invention have been shown and described in detail herein, those skilled in the art can readily devise many other varied embodiments that still incorporate these teachings.

What is claimed is:

1. Apparatus for biasing a workpiece upon a workpiece support comprising:
   a pedestal base;
   a shaft disposed below the pedestal base;
   a puck disposed above the pedestal base;
   an enclosure defined by a lower inner wall of the shaft, a floor of the pedestal base, an upper inner wall of the pedestal base and a bottom surface of the puck; and
   an electrode positioned within the enclosure to electrically bias the workpiece.

2. The apparatus of claim 1 wherein the enclosure is provided with an insulator to electrically isolate the electrode from the pedestal base.

3. The apparatus of claim 2 wherein the insulator is an isolator ring fabricated from a dielectric material and is proximate the upper inner wall of the pedestal base.

4. The apparatus of claim 3 wherein the electrode is disposed on a lip of the isolator ring.

5. The apparatus of claim 4 wherein the isolator ring further defines one or more recesses, each recess having a spring disposed therein for maintaining tensioned contact between the electrode and the puck.

6. The apparatus of claim 5 wherein the isolator ring is ceramic.

7. The apparatus of claim 2 further comprising one or more isolators wherein each isolator encases a thermocouple or pipe located within the enclosure.

8. The apparatus of claim 2 further comprising a bellows isolator and a bellows thermocouple mount fabricated from an insulating material.

9. The apparatus of claim 8 wherein the bellows isolator is a cylindrical sleeve disposed against the lower inner wall of the shaft and the bellows thermocouple mount is ring shaped and disposed above the bellows isolator.

10. The apparatus of claim 9 wherein the bellows isolator and bellows thermocouple mount are ceramic.

11. The apparatus of claim 2 wherein the electrode electrically biases the workpiece via connection to an RF power source.

12. The apparatus of claim 11 wherein the electrode is a cooling plate and the connection of the cooling plate to the RF power source is a coolant tube fabricated of an RF conducting material and is disposed in a channel in a bottom of the cooling plate.

13. The apparatus of claim 12 wherein the coolant tube is stainless steel.

14. The apparatus of claim 13 wherein the coolant tube further has a plurality of platings.

15. The apparatus of claim 14 wherein one of the plurality of platings is copper and another of the plurality of platings is nickel.

16. The apparatus of claim 12 wherein the coolant tube circumscribes nearly the entire bottom of the cooling plate, extends to the bottom of the pedestal base and is connected to a coolant source via electrically insulating coolant lines.

17. The apparatus of claim 1 wherein the electrode is brazed to the puck.

18. The apparatus of claim 16 wherein the plate has a plurality of grooves in a top surface to extract heat from the puck.

19. The apparatus of claim 18 wherein the plurality is three.

20. The apparatus of claim 2 wherein the puck is an electrostatic chuck.

21. Apparatus for biasing and retaining a workpiece upon a workpiece support in a workpiece processing system comprising:
    a shaft;
    a pedestal base disposed above the shaft;
    an electrostatic chuck disposed above the pedestal base;
    a cooling plate disposed beneath said chuck, coupled to a biasing source, having three grooves in a top surface and a channel in a bottom having a stainless steel coolant tube with copper and nickel platings disposed therein, the coolant tube circumscribing nearly the entire bottom of the cooling plate, extending to and having electrically insulating fittings at the bottom of the pedestal base, and
    an enclosure defined by a lower inner wall of the shaft, a floor of the pedestal base, an upper inner wall of the pedestal base and a bottom surface of the electrostatic chuck wherein the enclosure is provided with;
    a ceramic isolator ring circumscribing the upper inner wall of the pedestal base to electrically isolate the cooling plate from the pedestal base, the isolator ring having a lip upon which the cooling plate is disposed and defining one or more recesses, each of the recesses having a spring disposed therein for maintaining tensioned contact between the cooling plate and the electrostatic chuck,
    one or more isolators, each isolator encasing a thermocouple or pipe located within the enclosure,
    a ceramic cylindrical sleeve bellows isolator disposed against the lower inner wall of the shaft, and
    a ceramic ring shaped bellows thermocouple mount disposed above the bellows isolator.

22. The apparatus of claim 1, wherein the top surface of the electrode is biased in contact with the puck.

23. Apparatus for biasing and retaining a workpiece upon a workpiece support comprising:
    a pedestal base;
    a shaft disposed below the pedestal base;
    a puck disposed above the pedestal base to support and retain the workpiece;
    an enclosure defined by a lower inner wall of the shaft, a floor of the pedestal base, an upper inner wall of the pedestal base and a bottom surface of the puck, wherein the enclosure is provided with an insulator to electrically isolate the electrode from the pedestal base, wherein the insulator is an isolator ring fabricated from a dielectric material and is proximate the upper inner wall of the pedestal base; and
    an electrode disposed beneath said puck to electrically bias the workpiece, wherein the electrode is disposed on a lip of the isolator ring, wherein the isolator ring further defines one or more recesses, each recess having a spring disposed therein for maintaining tensioned contact between the electrode and the puck.

24. The apparatus of claim 1 wherein the electrode has at least one groove in a top surface, the at least one groove is configured to provide a desired heat transfer between the electrode and the puck.

* * * * *